(12) United States Patent
Stadtfelder

(10) Patent No.: US 11,885,833 B2
(45) Date of Patent: Jan. 30, 2024

(54) POSITION-COMPENSATED CURRENT MEASURING DEVICE

(71) Applicant: Phoenix Contact GmbH & Co. KG, Blomberg (DE)

(72) Inventor: Tobias Stadtfelder, Bad Pyrmont (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 359 days.

(21) Appl. No.: 17/295,795

(22) PCT Filed: Nov. 19, 2019

(86) PCT No.: PCT/EP2019/081807
§ 371 (c)(1),
(2) Date: May 20, 2021

(87) PCT Pub. No.: WO2020/109084
PCT Pub. Date: Jun. 4, 2020

(65) Prior Publication Data
US 2022/0026468 A1    Jan. 27, 2022

(30) Foreign Application Priority Data

Nov. 27, 2018    (BE) .................................. 2018/5829

(51) Int. Cl.
*G01R 15/20*    (2006.01)
*G01R 19/32*    (2006.01)

(52) U.S. Cl.
CPC ......... *G01R 15/202* (2013.01); *G01R 15/205* (2013.01); *G01R 15/207* (2013.01); *G01R 19/32* (2013.01)

(58) Field of Classification Search
CPC .. G01R 15/202; G01R 15/205; G01R 15/207; G01R 19/32
See application file for complete search history.

(56) References Cited

U.S. PATENT DOCUMENTS

2005/0156587 A1*  7/2005  Yakymyshyn ....... G01R 15/207
                                                                324/117 R
2006/0043960 A1    3/2006  Itoh et al.
(Continued)

FOREIGN PATENT DOCUMENTS

CN    103529267 A    1/2014
CN    104764928 A    7/2015
(Continued)

OTHER PUBLICATIONS

English translation of International Preliminary Report on Patentability, Int. Application No. PCT/EP2019/081807, Int. Filing Date: Nov. 19, 2019, Applicant: Phoenix Contact GmbH & Co. KG, dated Jun. 10, 2021.
(Continued)

*Primary Examiner* — Alvaro E Fortich
(74) *Attorney, Agent, or Firm* — Reising Ethington P.C.

(57) ABSTRACT

The present disclosure relates to a current measuring transducer for measuring an electric current in an electrical conductor that can be arranged so as to extend through the current measuring transducer, comprising a housing base portion and a housing mating portion coupled to one another, wherein the electrical conductor can be arranged in a central through opening between the housing base portion and the housing mating portion, wherein the housing base portion comprises a first part of a probe ring and the housing mating portion comprises a second part thereof, and comprises at least two sensors for simultaneously measuring the electric current in the electrical conductor, and further comprises an evaluation device in the current measuring transducer for simultaneously evaluating sensor signals and for outputting a corrected output signal.

20 Claims, 4 Drawing Sheets

(56) References Cited

U.S. PATENT DOCUMENTS

| | | | |
|---|---|---|---|
| 2010/0045286 A1* | 2/2010 | Hotz | G01R 15/207 |
| | | | 324/260 |
| 2012/0319676 A1 | 12/2012 | E-Essawy et al. | |
| 2014/0009143 A1 | 1/2014 | Blagojevic et al. | |
| 2014/0009146 A1 | 1/2014 | Blagojevic et al. | |
| 2014/0167720 A1 | 1/2014 | Akieda et al. | |
| 2015/0212117 A1* | 7/2015 | Hackner | G01R 15/207 |
| | | | 324/117 H |
| 2016/0356820 A1* | 12/2016 | Ausserlechner | G01R 35/005 |

FOREIGN PATENT DOCUMENTS

| | | |
|---|---|---|
| CN | 105182044 A | 12/2015 |
| CN | 205404673 U | 7/2016 |
| CN | 106093548 A | 11/2016 |
| DE | 102005013232 A1 | 9/2006 |
| DE | 60026952 T2 | 11/2006 |
| DE | 102007035184 A1 | 2/2009 |
| DE | 102014119276 A1 | 6/2016 |
| DE | 102015100924 B3 | 6/2016 |
| WO | 9520167 A1 | 7/1995 |
| WO | WO2010106304 A1 | 9/2010 |
| WO | 2016030197 A1 | 3/2016 |

OTHER PUBLICATIONS

Belgium Search Report, Belgium Application No. BE2018/5829, Applicant: Phoenix Contact GmbH & Co. KG, dated Aug. 19, 2019.
International Search Report and Written Opinion, Int. Application No. PCT/EP2019/081807, Int. Filing Date: Nov. 19, 2019, Applicant: Phoenix Contact GmbH & Co. KG, dated Feb. 25, 2020.
German Office Action, File No. 10 2018 129 907.9, Applicant: Phoenix Contact GmbH & Co. KG, dated Jul. 8, 2019.
CN Office Action for CN Application No. 201980078339.4 dated Aug. 26, 2023 (25 pages).

* cited by examiner

POSITION-COMPENSATED CURRENT MEASURING DEVICE

FIELD

The present disclosure relates to a position-compensated current measuring device for measuring an electric current flowing through an electrical conductor.

BACKGROUND

Current measuring transducers of various versions have been described in the literature. They are used to sense the electric current flowing through or present in an electrical conductor and to output a usable signal that reflects the electric current, i.e. amperage. Current measuring transducers that are available comprise invasive current measuring means such as a needle that is pierced into the conductor. Also, non-contact current measuring transducers are known, which sense the electric current in the electrical conductor without contacting it. Such prior art current measuring transducers may comprise a probe ring which forms a closed loop around the electrical conductor so that the electrical conductor extends through the probe ring of the current measuring transducer.

The non-contact current measuring transducer allows for electrical separation or potential separation between the electrical conductor on the one hand and the current measuring transducer on the other hand. This protects the current measuring transducer from the sometimes high electric current or voltage in the electrical conductor.

Known current measuring transducers may have a housing which extends around the electrical conductor in a closed loop shape. An accommodation area for receiving the electrical conductor is thus defined inside the housing. The housing includes a probe ring which focuses the magnetic field surrounding the conductor. A probe may be integrated in the probe ring, which can be used to measure the electric current of the conductor.

Examples of the aforementioned known designs can be found, in US 2015/0212117 A1, for example, or in DE 10 2007 035 184 A1, or US 2013/0342188 A1, or DE 10 2014 119 276 A1.

From DE 10 2007 035 184 A1 it is known to use a plurality of magnetic field sensors in order to compensate for external interfering fields.

However, errors that are attributable to the arrangement itself cannot be corrected or only inadequately with the aforementioned designs. For example, it is known to use positioning aids that help avoid misalignments, e.g. from the aforementioned DE 10 2007 035 184 A1. However a probe ring that is misaligned, will still measure incorrectly, and a person skilled in the art will not readily recognize such an incorrect measurement.

Furthermore, the known set ups are limited in that the electrical conductor to be measured has to be arranged inside the probe ring exactly in the center thereof to avoid incorrect measurement. To this end, prior art probe rings are potted around the cable to be measured, for example. The aforementioned DE 10 2007 035 184 A1 uses clamping jaws for this purpose, which are intended to hold the conductor as close as possible to the center of the arrangement. However, if the clamping jaws are forgotten or not applied correctly, or when they age, this will again result in an incorrect measurement and the skilled person will not be able to readily attribute the resulting error in the low percentage range to the incorrect set up.

However, nowadays, it is considered necessary to achieve the smallest possible measurement error when measuring electric currents in an electrical conductor, if possible even a measurement error of less than 1% of the measured value or less.

GENERAL DESCRIPTION

In order to achieve the desired low error rate of a current measuring transducer, it must furthermore be possible to compensate for such errors that are attributable to the arrangement of the current measuring transducer itself. Additionally, deviations in the order of micrometers in the arrangement of the probe ring can already produce measurement errors in the percent range.

Therefore, the present disclosure allows to compensate for errors inherent in the arrangement. Such a self-compensating current measuring transducer offers a convenient basis for a current measurement, since the current measuring transducer according to the present disclosure is able to automatically compensate for incorrect adjustments. For example, the present disclosure allows a more convenient and quick installation and at the same time enhances error tolerance and durability of a current measuring transducer.

Since, as a result of the present disclosure of a self-compensating current measuring transducer, it is no longer necessary to try out and adjust a plurality of devices in a time-consuming way in order to achieve an acceptable measurement with particularly low error values, the present self-compensating current measuring transducer, overall, is particularly cost-effective and of high quality.

The present disclosure therefore permits to overcome the drawbacks mentioned in the description in conjunction with prior art arrangements.

The current measuring transducer according to the present disclosure for measuring an electric current in an electrical conductor that can be arranged so as to extended through the current measuring transducer comprises a housing comprising a housing base portion and at least one housing mating portion that can be coupled with the housing base portion. The division of the housing into the base portion and the mating portion provides for a simple assembly around a conductor, for example around a conductor after the latter has already been electrically connected at both of its ends, without removing or severing the conductor.

In a closed state, the housing base portion of the current measuring transducer according to the present disclosure is coupled to the housing mating portion so as to conjointly define a central through opening, and the electrical conductor can be arranged in the central through opening between the housing base portion and the housing mating portion so that the electrical conductor extends through the housing.

Further, the housing base portion comprises a first part of a probe ring, the housing mating portion comprises a second part of the probe ring, so that in the closed state of the housing a closed loop probe ring is formed around the conductor when the conductor is arranged inside the current measuring transducer.

The current measuring transducer according to the present disclosure comprises at least two sensors for simultaneously measuring the electric current in the electrical conductor and for generating first and second sensor signals. In other words, two sensors are disposed in the current measuring transducer, which measure, simultaneously and independently of one another, the current in the electrical conductor and provide a respective measured value.

The current measuring transducer furthermore comprises an evaluation device in the current measuring transducer, which is configured for simultaneously evaluating the first and second sensor signals and for outputting a corrected output signal. Thus, an evaluation device is provided in the current measuring transducer, which has at least a first input for reading in the first sensor signal and a second input for reading in the second sensor signal, and which furthermore has an output for outputting a corrected output signal, which, for example, is calculated from the first sensor signal and from the second sensor signal. Depending on the computing power of the evaluation device, the simultaneous evaluation may involve a short-term memory and sequential processing of the arithmetic operators, or actual parallel processing of the two sensor signals.

The current measuring transducer according to the present disclosure thus takes into account signals from at least two different sensors which are, by way of example, arranged at different locations of the probe ring, for example at opposed locations, so that the electrical conductor is arranged between the first sensor and the second sensor. The at least two different sensor signals, i.e. the plurality of sensor signals, are read in and processed by the evaluation device.

In one example, the evaluation device performs averaging over the plurality of sensor signals by adding up the absolute values of the plurality of sensor signals and dividing the sum by the number of sensor signals. Subtraction of the sensor signals from one another can also lead to the corrected output signal.

The evaluation device may be accommodated in the housing mating portion. If the housing base portion includes provisions for fastening the current measuring transducer to a carrier such as a fixing rail, the accommodation of the evaluation device in the housing mating portion ensures damping or partial decoupling from the carrier.

The evaluation device may comprise a microcontroller for performing the calculations on the basis of the sensor signals.

The current measuring transducer may be configured for processing both DC voltage signals and AC voltage signals. This special function is only made possible by the fact that the evaluation device processes the sensor signals, for example by averaging. The present embodiment of the current measuring transducer according to the present disclosure is capable of processing—if need should be, simultaneous processing—of DC and AC voltage signals.

The evaluation device can simultaneously read in the first sensor signal and the second sensor signal and preferably process them so as to obtain signal balancing between the first sensor signal and the second sensor signal. Such signal balancing may involve the averaging mentioned above.

Thus, the current measuring transducer preferably provides automatic position compensation by correcting the first and second sensor signals with regard to a position of the electrical conductor in the current measuring transducer. In other words, the current measuring transducer is configured so as to output a compensated signal with low error deviation even if the electrical conductor is incorrectly positioned, and thus an incorrect position is automatically compensated for. Manual adjustment or reassembly and time-consuming error detection can therefore be dispensed with.

This also allows to compensate for installation deviations in the assembly of the current measuring transducer around the electrical conductor, by signal balancing between the first sensor signal and the second sensor signal.

The evaluation device may be configured for achieving the signal balancing between the at least two sensor signals by averaging over the sensor signals.

In an additional embodiment, the housing base portion and the housing mating portion may both have interengagable latching means for latching the housing mating portion to the housing base portion.

In a preferred embodiment, the housing base portion and the housing mating portion each have first and second probe ring end faces. In the closed state of the housing, the probe ring end faces of the housing base portion and of the housing mating portion adjoin one another.

In the closed state of the housing, the respective first and second probe ring end faces may define a common end face plane such that the probe ring end faces of the housing base portion and of the housing mating portion are located on opposite sides of the electrical conductor and in a common plane intersecting the electrical conductor. Preferably, the end face plane intersects the electrical conductor, for example through the center thereof.

In a preferred embodiment, the first sensor is arranged on the first probe ring end face and the second sensor is arranged on the second probe ring end face.

The probe ring may define first and second sensor accommodation areas on the probe ring end faces for receiving the sensors on the probe ring end faces.

In a preferred embodiment, the first and second sensor accommodation areas are each adapted to receive at least two sensors per probe ring end face.

Thus, a third sensor may be provided which is arranged adjacent to the first sensor, and a fourth sensor which is arranged adjacent to the second sensor. For example, the first and third sensors may be arranged in the first accommodation area in the probe ring, and the second and fourth sensors may, by way of example, be arranged in a second accommodation area in the probe ring. The evaluation device may read in and evaluate the sensor signals from the plurality of sensors in order to calculate a position compensation for the position of the electrical conductor. In other words, the evaluation device calculates the position compensation on the basis of the signals from all sensors that are arranged in the probe ring.

In a preferred embodiment, the sensors are in the form of magnetoresistive sensors or Hall sensors.

The housing base portion may comprise fixing means for fixing the current measuring transducer on a mounting rail or on a wall.

The housing mating portion may furthermore have electrical connectors for outputting the corrected output signal.

A preferred embodiment comprises at least one temperature sensor connected to the evaluation device, for temperature compensation of the first and second sensor signals. Thus, the evaluation device is able to evaluate further input signals such as the temperature signal and/or an additionally connected voltage signal in order to further correct the corrected output signal with regard to external influences and/or to provide power or energy values.

The present disclosure furthermore encompasses the use of the aforementioned current measuring transducer for tool-free attachment on an electrical conductor that is connected at both of its connection ends, for position-compensated measurement of the current flowing in the electrical conductor.

DETAILED DESCRIPTION

Figure 1:
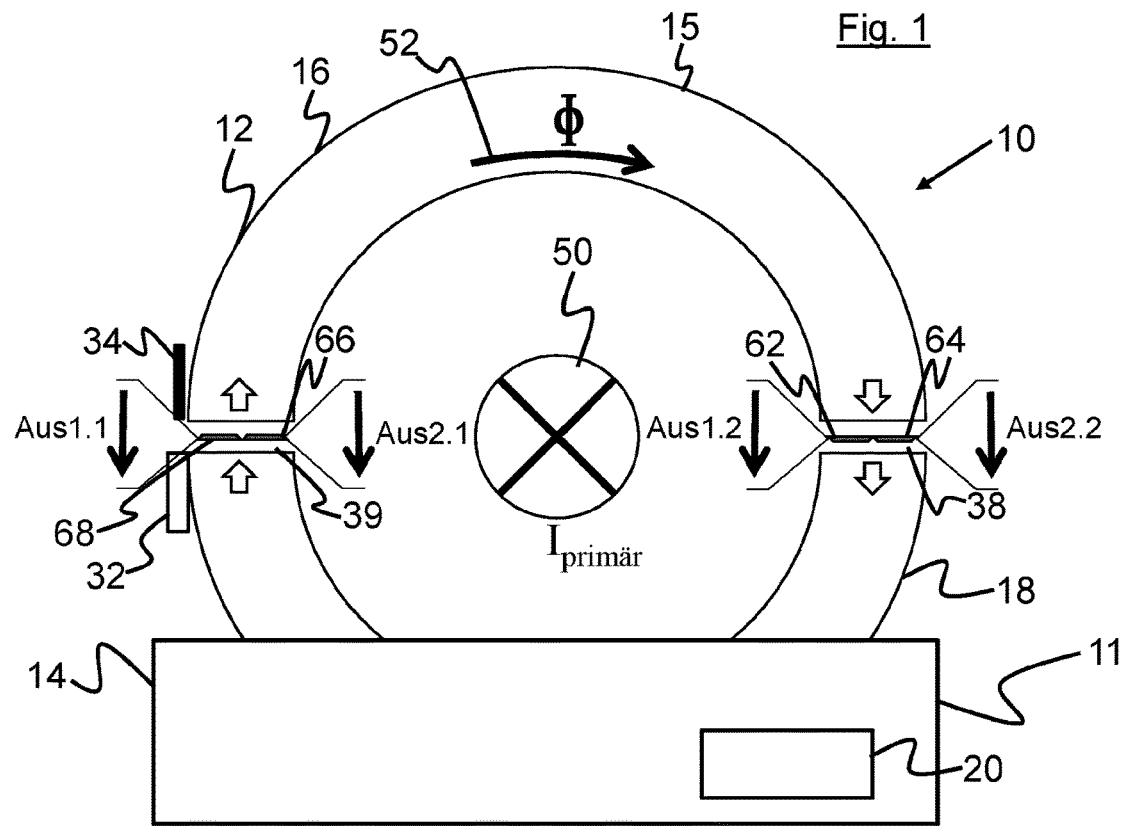
FIG. 1 shows a first embodiment of the current measuring transducer.

Referring to FIG. 1, a first embodiment of a current measuring transducer 10 is shown with an electrical conductor 50 arranged therein. Current measuring transducer 10 comprises a housing base portion 12 comprising a first part 16 of the probe ring 15. The current (_primary flowing through the electrical conductor 50 induces a magnetic field flux 52 in probe ring 15.

A housing mating portion 14 comprises a second part 18 of probe ring 15. It also comprises an evaluation device 20, which can be used to evaluate and compensate the sensor signals from field sensors 62, 64, 66, and 68. In this example, fixing means 32, 34 are provided which are interengagable in order to close the probe ring 15 and to bring the housing 11 into the closed state.

Field sensors 62, 64 are arranged next to one another in a first accommodation area 38. Field sensors 66, 68 are arranged next to one another in a second accommodation area 39. In the case of a perfect set up in which the housing 11 as a whole is assembled without errors and the electrical conductor 50 is placed perfectly in the center, each field sensor 62, 64, 66, 68 will experience the same field flux 52 in the probe ring 15 and therefore deliver identical measurement results Out 1.1, Out 2.1, Out 1.2, Out 2.2. In this embodiment of FIG. 1, the field sensors 62, 64 and 66, 68, respectively, which are disposed jointly in a respective accommodation area 38, 39, are each installed in the same direction. Therefore, if the current measuring transducer 10 is installed correctly, the measured magnetic field will not only have the same absolute value but also the same direction. The direction of field flux is indicated by the arrow designated by 52.

The current measuring transducer is able to measure alternating currents and direct currents up to 600 A, for example, without saturating. Especially in the case of alternating currents, the frequency of the primary current may lead to magnetization reversals in the core material of the probe ring 15. The resulting forces may cause the probe ring 15 to oscillate or vibrate, so that the height of the accommodation areas 38, 39 may fluctuate. However, the height of accommodation areas 38, 39 will usually have a considerable impact on the probe signal obtained. With a change of just a few micrometers, the magnetic flux to be detected at the sensor will change in the single-digit percentage range. The correction calculation by evaluation device 20 is able to also suppress such interferences and to operate at lower error rates even in the case of high alternating currents such as between 400 and 600 amperes, i.e. to achieve an error tolerance of less than 1% of the measured value.

The use of sensors pairs 62, 68 and 64, 66 may be exploited for a further refinement of the present disclosure. If the sensors of the respective pairs differ, i.e. for example sensors 62, 68 and sensors 64, 66, it is possible to additionally sense in different measuring ranges. When a measuring range of sensor 62 is exceeded or undershot, a switch can then be made to the measuring range of sensor 64, etc.

Because of the high currents to be detected, the core material preferably used for the probe ring 15 is wound silicon iron. Once the winding process has been completed, the core is divided into two halves of equal size, for example. In order to limit the magnetic flux through sensors 62, 64, 66, 68, the height of the accommodation area 38, 39 can be adjusted to 2.2 millimeters, for example. In this way, settings can be made such that the measuring ranges of the sensor elements are not exceeded even in the case of the intended current of 600 amperes AC, for example. This allows to use sensors with a measuring range of up to 200 mT, for example.

Figure 2:
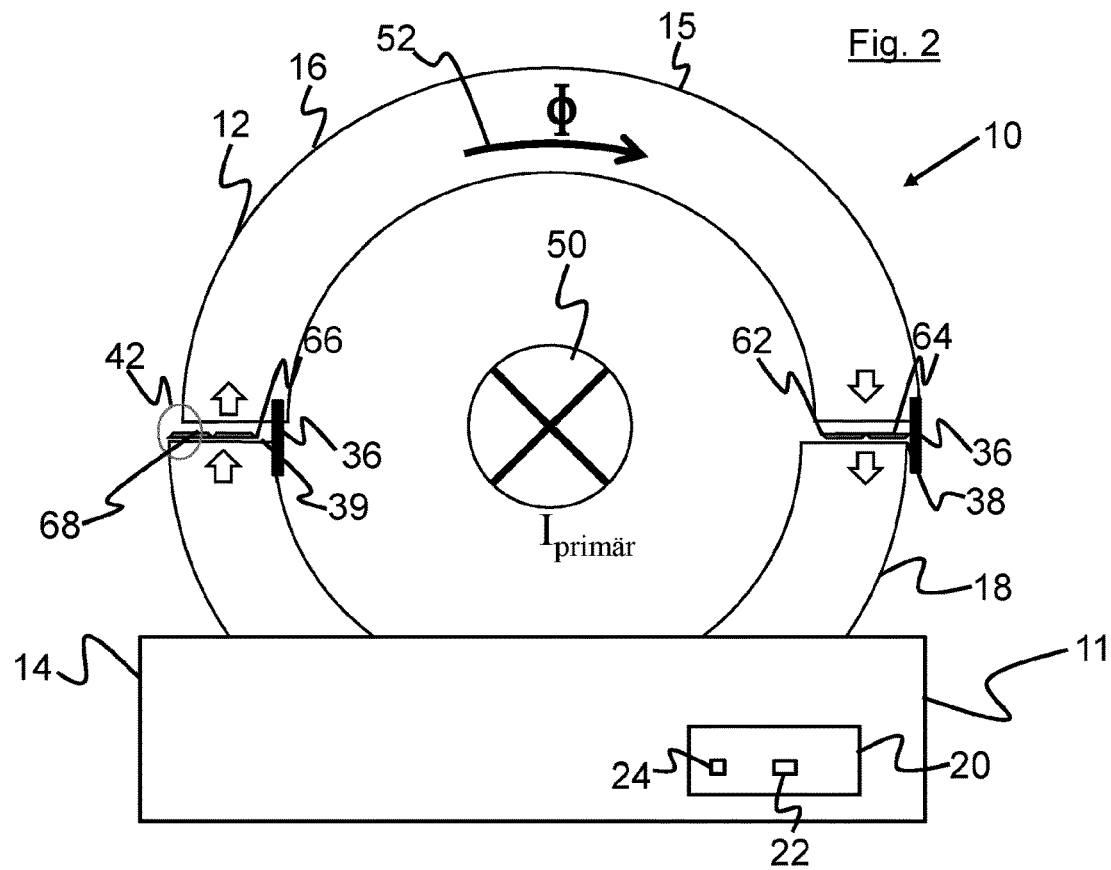
FIG. 2 shows a further embodiment of the current measuring transducer.

Referring to FIG. 2, a current measuring transducer 10 is shown in which the housing 11 was not correctly fitted together or connected. Rather, the current measuring transducer 10 was plugged together with an assembly error 42, and in order to improve the understanding, the assembly error 42, i.e. the radial offset between housing base portion 12 and housing mating portion 14 is exaggerated in the illustration. The fixing means 36 provided on the housing base portion 12 and intended to be introduced into an opening (not shown) in the housing mating portion 14, were not correctly introduced in this example, but rather extend alongside the housing mating portion 14.

In the embodiment shown in FIG. 2, field sensors 62, 64, 66, and 68 will sense field strengths of different absolute values. However, the sensor signals from field sensors 62, 64, 66, 68 are then forwarded to the evaluation device 20 and compensated. For example, the evaluation device 20 is able to perform signal transformations or signal calculations using a microcontroller 22. For example, the evaluation device 20 has an analog-to-digital converter (ADC) 24. The incoming analog signals from field sensors 62, 64, 66, 68 are then converted into digital signals in evaluation device 20 so that digital arithmetic operations can be performed on the signals. For example, the evaluation device 20 is able to calculate a mean value from the plurality of digital sensor signals from the field sensors 62, 64, 66, 68. The mean value will then have a significantly smaller error than the individual measured value. Evaluation device 20 may also perform such averaging over a longer period of time, for example, so that fluctuations over time can also be eliminated. In the case of a direct current flowing through the electrical conductor 50, for example, this allows, in a simple manner, to compensate for external electrical or magnetic alternating fields as well.

Figure 3:
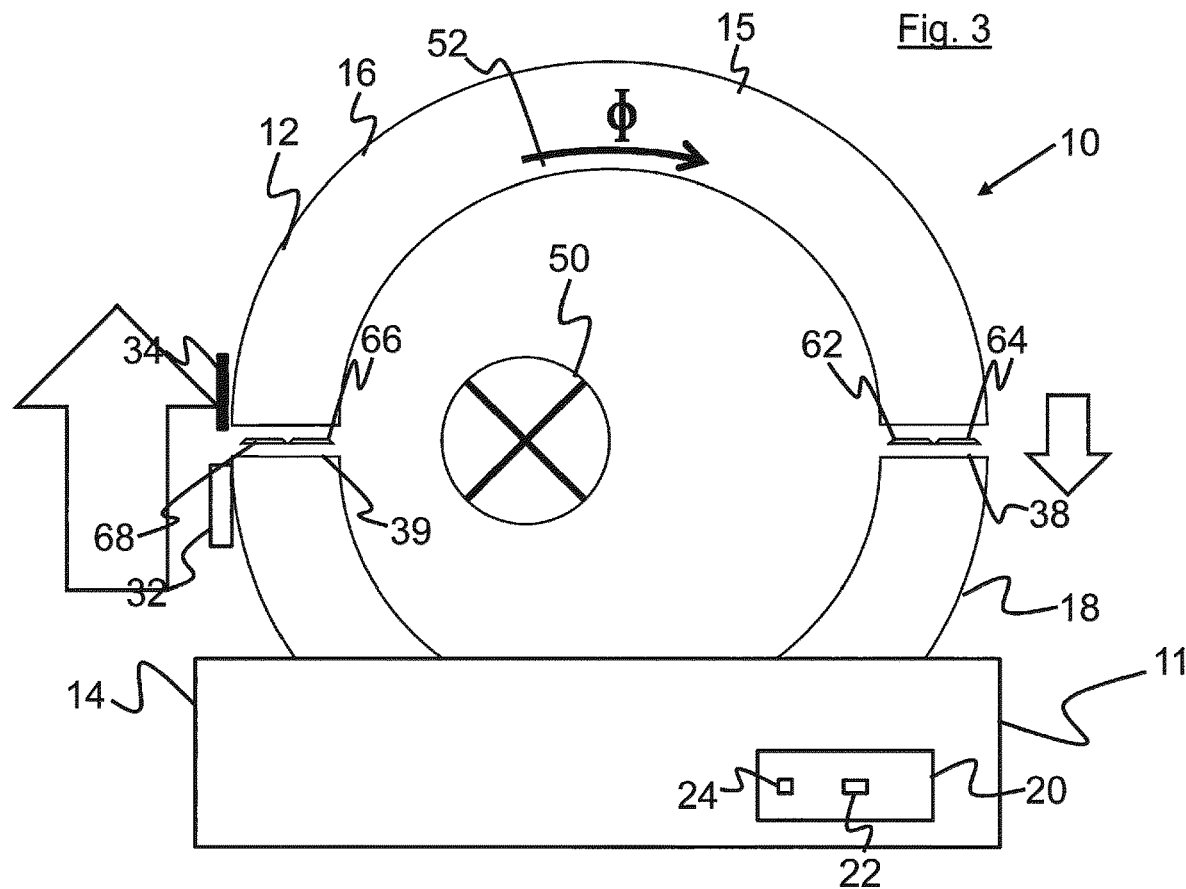
FIG. 3 shows yet another embodiment of the current measuring transducer, where an electrical conductor is installed with an offset.

Referring to FIG. 3, an embodiment of the current measuring transducer 10 is shown in which the electrical conductor 50 is arranged eccentrically. Although, in principle, this does not cause a change in the field flux direction 52, the absolute value of the induced field strength at field sensors 62, 64 will differ from that sensed by field sensors 66, 68. In other words, the magnetic field strength prevailing in the first accommodation area 38 will be different from that in the second accommodation area 39.

The sensor data are processed by evaluation device 20, for example converted into digital data by ADC 24 and, for example, a mean value is calculated from the sensor data. The mean value calculated by evaluation device 20, i.e. the output signal of evaluation device 20, represents a position-compensated signal, in which the relative position of the electrical conductor 50 in current measuring transducer 10 has been compensated for with regard to the electric current. Therefore, time-consuming adjustments of the current measuring transducer 10 can be dispensed with, and a change in position of the electrical conductor 50 in the current measuring transducer 10 can be compensated for without having to recalibrate or realign the current measuring transducer 10.

Figure 4:
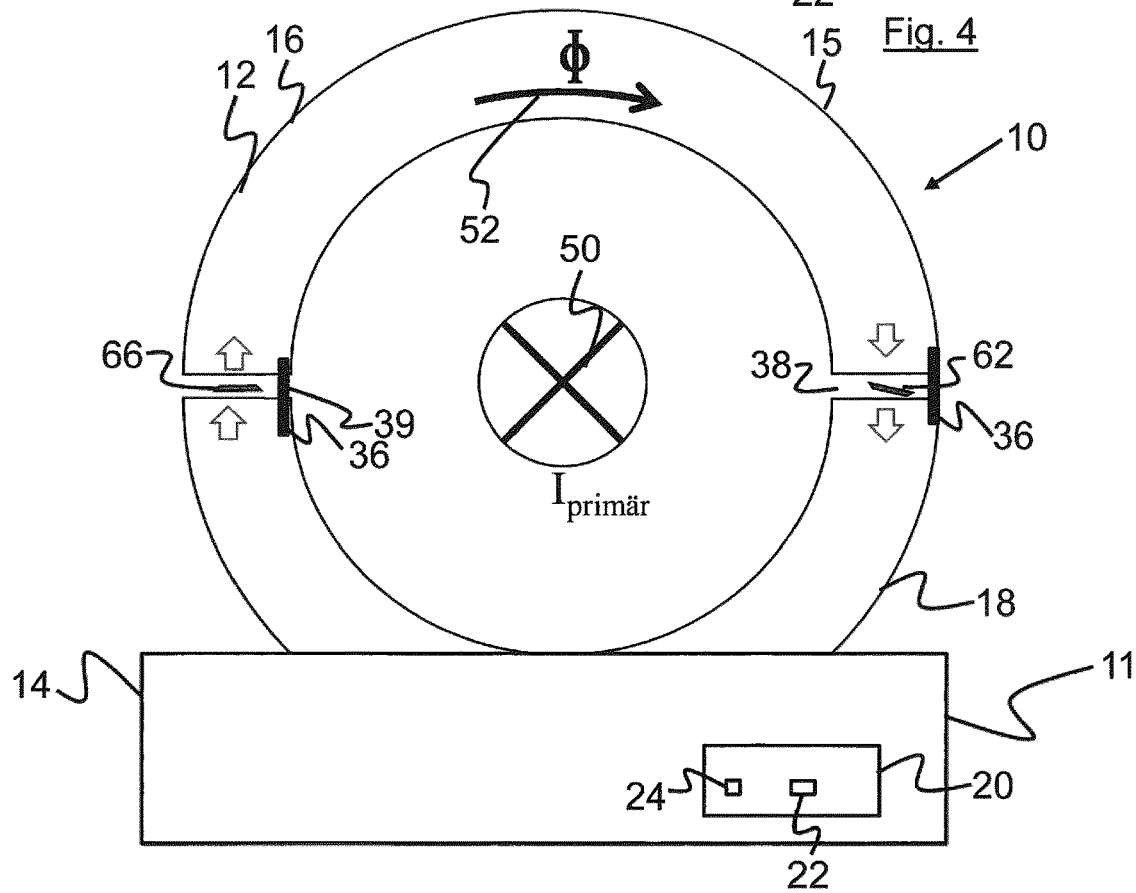
FIG. 4 shows an embodiment of the current measuring transducer with an incorrectly installed sensor.

Referring to FIG. 4, yet another embodiment of a current measuring transducer 10 is shown, in which the sensor 62 is dislocated, in the present case it is installed in a rotated orientation (the rotation is shown exaggerated for greater clarity). Since sensors such as Hall sensors detect the magnetic flux perpendicular across the sensor, the magnitude measured by sensor 62 will be smaller than the magnitude measured at sensor 66. Evaluation device 20 averages the sensor signals 62, 66 so that the resulting measurement error is significantly reduced.

The common circuit board for evaluation device 20 may, for example, also provide wiring for a power supply 28 unit and for output interface 26. The latter is integrated into the housing mating portion 14, for example parallel to the second core half 18. The sensors are electrically connected at an angle of 90° relative to the circuit board, for example. Especially the positioning of four Hall sensors allows to detect position-related deviations also by furthermore comparing to one another and accounting for the output signals of the respective sensor pairs in the calculation. At the same time, the circuit becomes more robust against external magnetic fields that might couple into one of the two air gaps or accommodation areas 38, 39.

Figure 5:
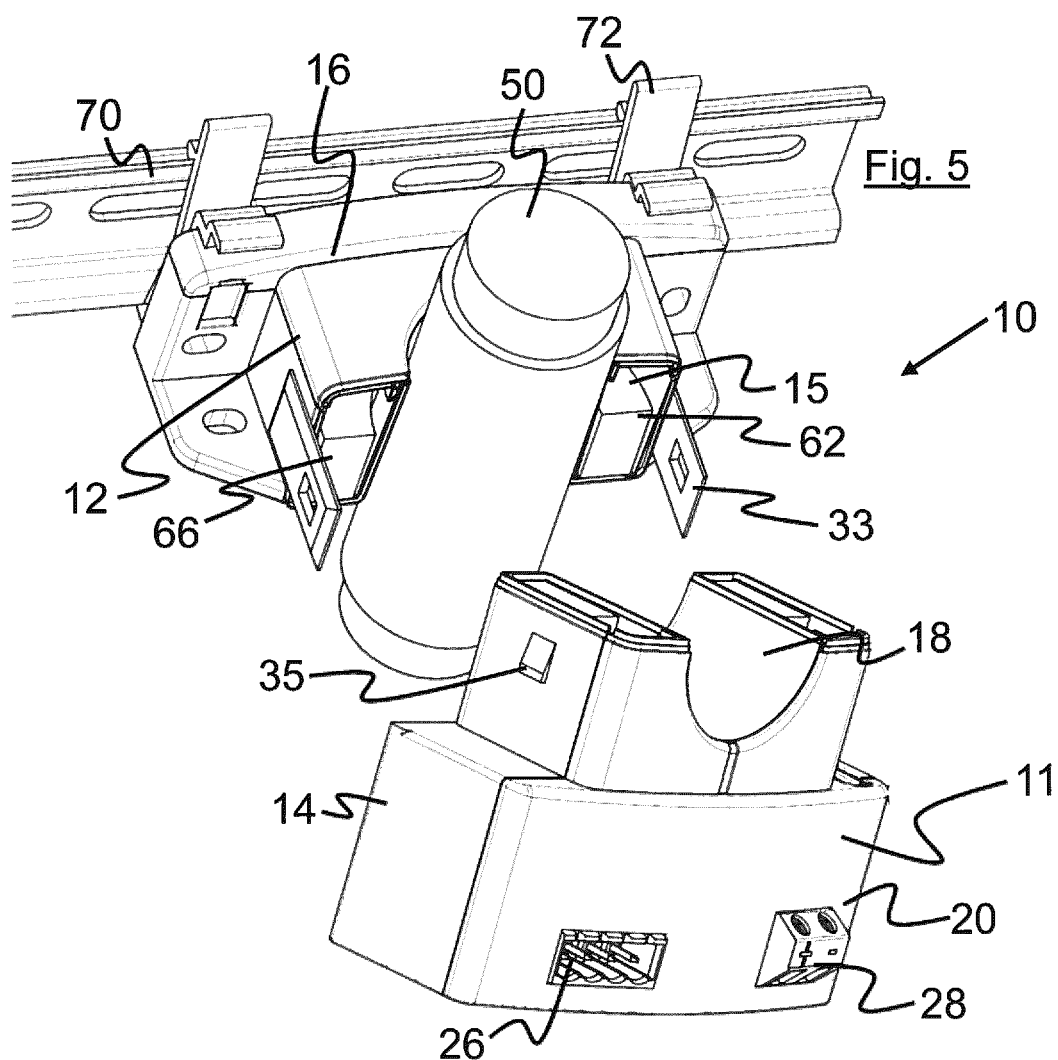
FIG. 5 shows an embodiment of the current measuring transducer in an open state.

FIG. 5 shows an embodiment of a current measuring transducer 10 in an open state. Features described for previous embodiments of the present disclosure are designated by the same reference numerals.

The housing base portion 12 shown in FIG. 5 is fixed on a mounting rail 70 by brackets 72. The evaluation device 20 is accommodated in housing mating portion 14. The evaluation device 20 outputs the position-compensated output signal via output interface 26. Housing base portion 12 can be coupled to housing mating portion 14 through latching means 33, 35. The current measuring transducer 10 may furthermore have a power supply 28 including a power source for supplying electric power to the electronics of current measuring transducer 10.

Figure 6:
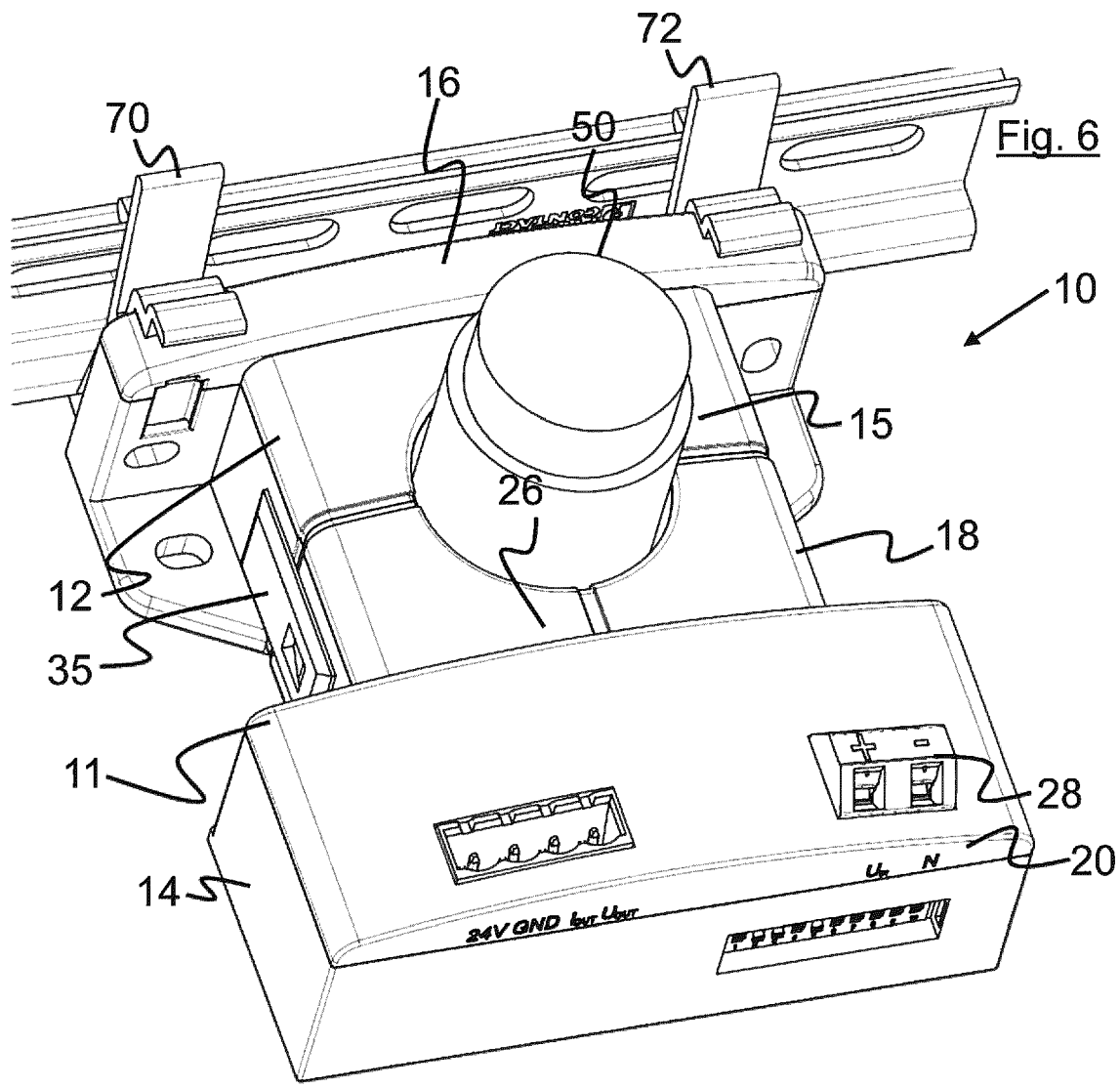
FIG. 6 shows the embodiment of the current measuring transducer of FIG. 5 in the closed state.

Referring to FIG. 6, the embodiment of current measuring transducer 10 shown in FIG. 5 is illustrated in its closed state. In the closed state of housing 11, the probe ring 15 completely surrounds the electrical conductor 50 circumferentially. The position-compensated output signal can be tapped at output interface 26.

It will be obvious for a person skilled in the art that the embodiments described above are to be understood as examples and that the invention is not limited thereto, but rather can be varied in various ways without departing from the scope of the claims. Furthermore, it will be appreciated that the features, regardless of whether they are disclosed in the description, the claims, the FIGURES or otherwise, also individually define components of the present disclosure, even if they are described together with other features. In all FIGURES, the same reference numerals designate the same items, so that descriptions of items that are possibly only mentioned in conjunction with one or at least not with all FIGURES can also be transferred to those FIGURES, for which such subject matter is not explicitly described in the description.

The invention claimed is:

1. A current measuring transducer for measuring an electric current in an electrical conductor that can be arranged so as to extend through the current measuring transducer, comprising:
   a housing, comprising:
      a housing base portion and at least one housing mating portion which can be coupled with the housing base portion;
      wherein, in a closed state, the housing base portion is coupled to the housing mating portion and a central through opening is defined, and wherein the electrical conductor can be arranged in the central through opening between the housing base portion and the housing mating portion so that the electrical conductor extends through the housing;
      wherein the housing base portion comprises a first part of a probe ring and the housing mating portion comprises a second part thereof, so that in the closed state of the housing a closed loop probe ring is formed around the conductor when the conductor is arranged inside the current measuring transducer;
   at least two sensors for simultaneously measuring the electric current in the electrical conductor and generating first and second sensor signals; and
   an evaluation device in the current measuring transducer, the evaluation device comprising a microcontroller configured for simultaneously evaluating the first and second sensor signals and for outputting a corrected output signal,
   wherein the housing base portion and the housing mating portion each have first and second probe ring end faces, wherein in the closed state of the housing, the probe ring end faces of the housing base portion and of the housing mating portion adjoin one another, and
   wherein the probe ring defines first and second sensor accommodation areas on the probe ring end faces for receiving one or more sensors per probe ring face.

2. The current measuring transducer of claim 1,
   wherein the evaluation device is accommodated in the housing mating portion; and/or
   wherein the current measuring transducer is configured to process both DC voltage signals and AC voltage signals.

3. The current measuring transducer as claimed in claim 1,
   wherein the evaluation device simultaneously reads in and processes the first sensor signal and the second sensor signal so as to perform signal balancing between the first sensor signal and the second sensor signal.

4. The current measuring transducer as claimed in claim 1, comprising automatic position compensation so that the first and second sensor signals are correctable with respect to a position of the electrical conductor in the current measuring transducer.

5. The current measuring transducer as claimed in claim 1, wherein installation deviations when assembling the current measuring transducer on the electrical conductor are compensated for by signal balancing between the first sensor signal and the second sensor signal.

6. The current measuring transducer of claim 5, wherein the evaluation device is configured for achieving signal balancing between the at least two sensor signals by averaging over the sensor signals.

7. The current measuring transducer as claimed in claim 1, wherein the housing base portion and the housing mating portion have interengagable latching means for latching the housing mating portion to the housing base portion.

8. The current measuring transducer as claimed in claim 1, wherein in the closed state of the housing, the respective first and second probe ring end faces define a common end face plane such that the probe ring end faces of the housing base portion and of the housing mating portion are located on opposite sides of the electrical conductor and in a common plane intersecting the electrical conductor, wherein, preferably, the end face plane intersects the electrical conductor, for example through the center thereof.

9. The current measuring transducer as claimed in claim 1, further comprising:
 a third sensor which is arranged adjacent to the first sensor; and
 a fourth sensor which is arranged adjacent to the second sensor; and
 wherein the evaluation device reads in and evaluates the sensor signals of the plurality of sensors in order to calculate a position compensation for the position of the electrical conductor.

10. The current measuring transducer as claimed in claim 1, wherein the sensors are in the form of magnetoresistive sensors or Hall sensors.

11. The current measuring transducer according to claim 10, wherein the housing base portion comprises fixing means for fixing the current measuring transducer on a mounting rail or on a wall.

12. The current measuring transducer as claimed in claim 1, wherein the housing mating portion has electrical connectors for measuring voltage signals and for outputting the corrected output signal.

13. The current measuring transducer as claimed in claim 1, further comprising at least one temperature sensor connected to the evaluation device for temperature compensation of the first and second sensor signals.

14. The current measuring transducer as claimed in claim 1, further comprising a tool-free attachment on the electrical conductor at both of its connection ends for position-compensated measurement of the current flowing in the electrical conductor.

15. The current measuring transducer as claimed in claim 9, wherein the first and third sensors are arranged in the first sensor accommodation area in the probe ring, and wherein the second and forth sensors are arranged in the second sensor accommodation area in the probe ring.

16. The current measuring transducer as claimed in claim 12, wherein the electrical connectors are adapted for outputting the corrected output signal in the form of power and energy values.

17. A current measuring transducer for measuring an electric current in an electrical conductor that can be arranged so as to extend through the current measuring transducer, comprising:
 a housing, comprising:
  a housing base portion and at least one housing mating portion which can be coupled with the housing base portion;
  wherein, in a closed state, the housing base portion is coupled to the housing mating portion and a central through opening is defined, and wherein the electrical conductor can be arranged in the central through opening between the housing base portion and the housing mating portion so that the electrical conductor extends through the housing;
  wherein the housing base portion comprises a first part of a probe ring and the housing mating portion comprises a second part thereof, so that in the closed state of the housing a closed loop probe ring is formed around the conductor when the conductor is arranged inside the current measuring transducer;
 at least two sensors for simultaneously measuring the electric current in the electrical conductor and generating first and second sensor signals;
 an evaluation device in the current measuring transducer, the evaluation device comprising a microcontroller configured for simultaneously evaluating the first and second sensor signals and for outputting a corrected output signal; and
 an automatic position compensation so that the first and second sensor signals are correctable with respect to a position of the electrical conductor in the current measuring transducer.

18. The current measuring transducer as claimed in claim 17, wherein the housing base portion and the housing mating portion each have first and second probe ring end faces, and wherein in the closed state of the housing, the probe ring end faces of the housing base portion and of the housing mating portion adjoin one another.

19. The current measuring transducer as claimed in claim 18, wherein the probe ring defines first and second sensor accommodation areas on the probe ring end faces for receiving one or more sensors per probe ring end face.

20. A current measuring transducer for measuring an electric current in an electrical conductor that can be arranged so as to extend through the current measuring transducer, comprising:
 a housing, comprising:
  a housing base portion and at least one housing mating portion which can be coupled with the housing base portion;
  wherein, in a closed state, the housing base portion is coupled to the housing mating portion and a central through opening is defined, and wherein the electrical conductor can be arranged in the central through opening between the housing base portion and the housing mating portion so that the electrical conductor extends through the housing;
  wherein the housing base portion comprises a first part of a probe ring and the housing mating portion comprises a second part thereof, so that in the closed state of the housing a closed loop probe ring is formed around the conductor when the conductor is arranged inside the current measuring transducer;
 at least two sensors for simultaneously measuring the electric current in the electrical conductor and generating first and second sensor signals;
 an evaluation device in the current measuring transducer, the evaluation device comprising a microcontroller configured for simultaneously evaluating the first and second sensor signals and for outputting a corrected output signal; and
 wherein the evaluation device is configured for achieving signal balancing between the at least two sensor signals by averaging over the sensor signals.

* * * * *